US011462556B2

(12) United States Patent
Furukawa et al.

(10) Patent No.: US 11,462,556 B2
(45) Date of Patent: *Oct. 4, 2022

(54) SEMICONDUCTOR MEMORY DEVICE

(71) Applicant: Kioxia Corporation, Tokyo (JP)

(72) Inventors: Tetsuya Furukawa, Yokohama (JP);
Tomoaki Shino, Kamakura (JP);
Mitsuhiro Noguchi, Yokohama (JP);
Shinichi Watanabe, Yokohama (JP);
Yukio Nishida, Fujisawa (JP);
Hiroyasu Tanaka, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 63 days.

This patent is subject to a terminal disclaimer.

(21) Appl. No.: 17/071,332

(22) Filed: Oct. 15, 2020

(65) Prior Publication Data

US 2021/0028185 A1   Jan. 28, 2021

Related U.S. Application Data

(63) Continuation of application No. 16/271,992, filed on Feb. 11, 2019, now Pat. No. 10,840,257.

(30) Foreign Application Priority Data

Aug. 27, 2018 (JP) .............................. JP2018-158713

(51) Int. Cl.
*H01L 27/11573* (2017.01)
*H01L 27/11526* (2017.01)
*H01L 29/49* (2006.01)
*H01L 29/06* (2006.01)
*H01L 29/51* (2006.01)
*H01L 29/423* (2006.01)

(52) U.S. Cl.
CPC .. *H01L 27/11573* (2013.01); *H01L 27/11526* (2013.01); *H01L 29/0619* (2013.01);
(Continued)

(58) Field of Classification Search
CPC ......... H01L 27/11573; H01L 27/11526; H01L 29/4983; H01L 29/0619; H01L 27/11565;
(Continued)

(56) References Cited

U.S. PATENT DOCUMENTS 7,344,976 B2   3/2008   Yoshida et al.
7,807,995 B2   10/2010  Mikawa et al.
(Continued)

FOREIGN PATENT DOCUMENTS

JP          3152215      4/2001
JP          4526587      8/2010
(Continued)

*Primary Examiner* — Julia Slutsker
(74) *Attorney, Agent, or Firm* — Oblon, McClelland, Maier & Neustadt, L.L.P.

(57) ABSTRACT

A semiconductor memory device includes: a semiconductor substrate; a memory cell array provided in a first region; a first transistor provided in a second region; a second transistor provided in a third region; and an insulative laminated film. The first and second transistors each include a semiconductor layer, a gate electrode, and a gate insulating film. A concentration of boron (B) in the gate electrode of the second transistor is higher than that of the first transistor. The insulative laminated film includes a first insulating film contacting the surface of the semiconductor substrate, and a second insulating film having a smaller diffusion coefficient of hydrogen (H) than that of the first insulating film. The second insulating film has a first portion contacting the semiconductor portion, and the first portion surrounds the third region.

20 Claims, 11 Drawing Sheets

(52) U.S. Cl.
CPC .... *H01L 29/42364* (2013.01); *H01L 29/4983* (2013.01); *H01L 29/513* (2013.01); *H01L 29/518* (2013.01)

(58) Field of Classification Search
CPC ............. H01L 27/11519; H01L 27/115; H01L 27/1157; H01L 27/11529; H01L 27/11524
See application file for complete search history.

(56) References Cited

U.S. PATENT DOCUMENTS

| | | | |
|---|---|---|---|
| 9,373,630 | B2 | 6/2016 | Toba et al. |
| 9,530,855 | B2 | 12/2016 | Suzuki et al. |
| 2013/0270568 | A1 | 10/2013 | Rabkin |
| 2014/0213030 | A1* | 7/2014 | Tsukuda ............ H01L 27/11563 438/287 |
| 2016/0268304 | A1 | 9/2016 | Ikeda et al. |
| 2017/0207242 | A1 | 7/2017 | Yamazaki |
| 2017/0213839 | A1* | 7/2017 | Yang ................. H01L 21/02164 |
| 2018/0083029 | A1 | 3/2018 | Tanaka et al. |

FOREIGN PATENT DOCUMENTS

| | | |
|---|---|---|
| JP | 4549937 | 9/2010 |
| JP | 2012-59766 | 3/2012 |
| JP | 2014-99551 | 5/2014 |
| JP | 2016-171243 | 9/2016 |
| JP | 2017-130654 | 7/2017 |

* cited by examiner

SEMICONDUCTOR MEMORY DEVICE

CROSS-REFERENCE TO RELATED APPLICATIONS

This application is a continuation of U.S. application Ser. No. 16/271,992 filed Feb. 11, 2019 and which is based upon and claims the benefit of Japanese Patent Application No. 2018-458713, filed on Aug. 27, 2018, the entire contents of each of which are incorporated herein by reference.

BACKGROUND

Field

Embodiments described below relate to a semiconductor memory device.

Description of the Related Art

High levels of integration of semiconductor memory devices proceeds.

DETAILED DESCRIPTION

Figure 1:
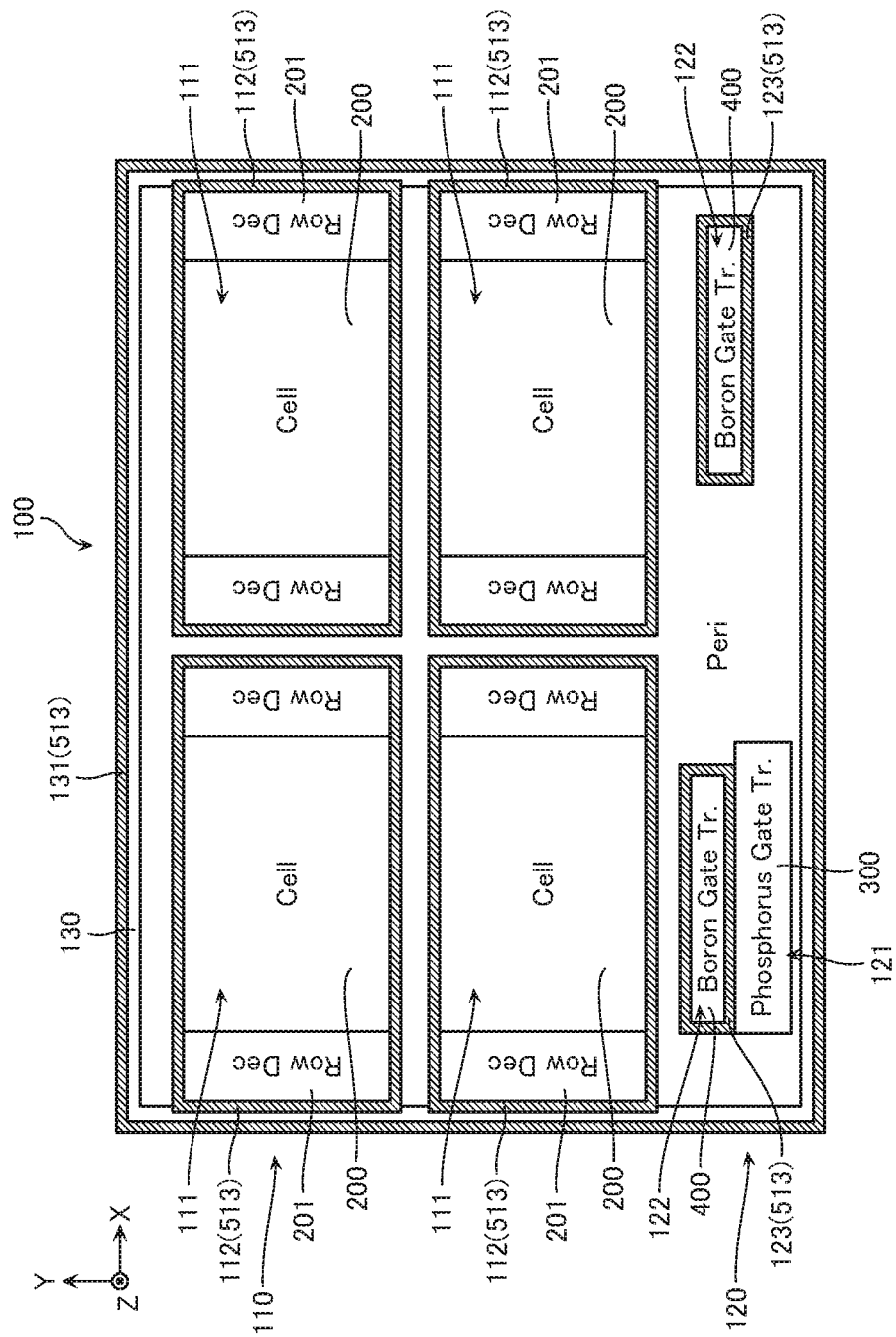
FIG. 1 is a schematic plan view of a semiconductor memory device according to a first embodiment.

A semiconductor memory device according to one embodiment includes: a semiconductor substrate having a semiconductor portion and an insulating portion provided on a surface; a memory cell array provided in a first region of the semiconductor substrate; a first transistor provided in a second region of the semiconductor substrate; a second transistor provided in a third region of the semiconductor substrate; and an insulative laminated film covering the surface of the semiconductor substrate, the first transistor and the second transistor. The first transistor and the second transistor each include a semiconductor layer including a part of the semiconductor substrate, a gate electrode facing the semiconductor layer, and a gate insulating film provided between the semiconductor layer and the gate electrode. The concentration of boron (B) in the gate electrode of the second transistor is higher than the concentration of boron in the gate electrode of the first transistor. The insulative laminated film includes a first insulating film in contact with the surface of the semiconductor substrate, and a second insulating film which is in contact with the first insulating film and has a smaller diffusion coefficient of hydrogen (H) than the first insulating film. The second insulating film has a first portion in contact with the semiconductor portion of the semiconductor substrate, and the first portion extends along an outer edge of the third region and surrounds the third region.

A semiconductor memory device according to one embodiment includes: a semiconductor substrate having a semiconductor portion and an insulating portion provided on a surface; a memory cell array provided in a first region of the semiconductor substrate; a transistor provided in a second region of the semiconductor substrate; and an insulative laminated film covering the surface of the semiconductor substrate and the transistor. The transistor includes a semiconductor layer including a part of the semiconductor substrate, a gate electrode facing the semiconductor layer, and a gate insulating film provided between the semiconductor layer and the gate electrode. The insulative laminated film includes a first insulating film in contact with the surface of the semiconductor substrate, and a second insulating film which is in contact with the first insulating film and has a smaller diffusion coefficient of hydrogen (H) than the first insulating film. The second insulating film has a first portion in contact with the semiconductor portion of the semiconductor substrate, and the first portion extends along the boundary portion between the first region and the second region so as to partition the first region and the second region.

A semiconductor memory device according to one embodiment includes: a semiconductor substrate having a semiconductor portion and an insulating portion provided on a surface; a memory cell array provided in a first region of the semiconductor substrate; a transistor provided in a second region of the semiconductor substrate; and an insulative laminated film covering the surface of the semiconductor substrate and the transistor. The transistor includes a semiconductor layer including a part of the semiconductor substrate, a gate electrode facing the semiconductor layer, and a gate insulating film provided between the semiconductor layer and the gate electrode. The insulative laminated film includes a first insulating film in contact with the surface of the semiconductor substrate, and a second insulating film which is in contact with the first insulating film and has a smaller diffusion coefficient of hydrogen (H) than the first insulating film. The second insulating film has a first portion in contact with the semiconductor portion of the semiconductor substrate, and the first portion extends along the outer edge of the surface of the semiconductor substrate and surrounds the first region and the second region.

Next, the semiconductor memory devices according to embodiments will be described in detail with reference to the drawings. Note that the embodiments below are merely examples and are not shown with the intention of limiting the present invention.

In addition, in the present specification, meanings of expressions such as "upward"/"downward," "upper"/"lower," "above"/"below," and the similar expressions are defined with reference to the substrate. For example, when a direction intersecting with the surface of the substrate is defined as a first direction, a direction away from the substrate along the first direction is referred to as an upward direction, and a direction approaching the substrate is referred to as a downward direction. Moreover, when a lower surface and a lower end of a certain configuration are referred to, they are respectively assumed to mean a surface and an end of the configuration on the closer side with respect to the substrate, and when an upper surface and an upper end of a certain configuration are referred to, they are respectively assumed to mean a surface and an end of the configuration on the farther side with respect to the substrate. In addition, when it is described that a first configuration is provided "above the substrate", this is assumed to mean that the first configuration is provided away from the substrate along the first direction. Furthermore, when it is described that a second configuration is provided "below" the first configuration, this is assumed to mean that the second configuration is closer to the substrate than the first configuration. In addition, when a direction intersecting with the first direction is defined as a second direction, a surface intersecting with the second direction is referred to as a side surface.

First Embodiment

[Configuration]

FIG. 1 shows a schematic plan view of the semiconductor memory device according to the first embodiment. For convenience of explanation, a part of the configuration is omitted in FIG. 1.

The semiconductor memory device according to the present embodiment includes a semiconductor substrate 100. On a surface of the semiconductor substrate 100, a memory cell array region 110 and a peripheral region 120 are provided. On the surface of the semiconductor substrate 100, an edge region 130 is provided which extends along the outer edge of the surface of the semiconductor substrate 100 and surrounds the memory cell array region 110 and the peripheral region 120.

In the memory cell array region 110, a plurality of small regions 111 are provided. In the illustrated example, two small regions 111 are arranged in the X direction, and two small regions 111 are arranged in the Y direction. In each of these small regions 111, there are provided a memory cell array 200 and a row decoder 201 for controlling the memory cell array 200. In the memory cell array region 110, a plurality of guard ring regions 112 are provided. The plurality of guard ring regions 112 extend along the outer edges of the small regions 111 and surround the small regions 111, respectively.

In the peripheral region 120, a plurality of small regions 121 and 122 are provided. In the small region 121, a plurality of transistors 300 (hereinafter referred to as "phosphorus gate transistor 300") are provided. The gate electrodes of the phosphorus gate transistors 300 contain impurities such as phosphorus (P). In the small region 122, a plurality of transistors 400 (hereinafter referred to as "boron gate transistors 400") are provided. The gate electrodes of the boron gate transistors 400 contain impurities such as boron (B). In addition, in the peripheral region 120, a plurality of guard ring regions 123 are provided which extend along the outer edges of the small regions 122 and surround the small regions 122, respectively.

In the edge region 130, a guard ring region 131 is provided which extends along the outer edge of the surface of the semiconductor substrate 100 and surrounds the memory cell array region 110 and the peripheral region 120.

Figure 6:
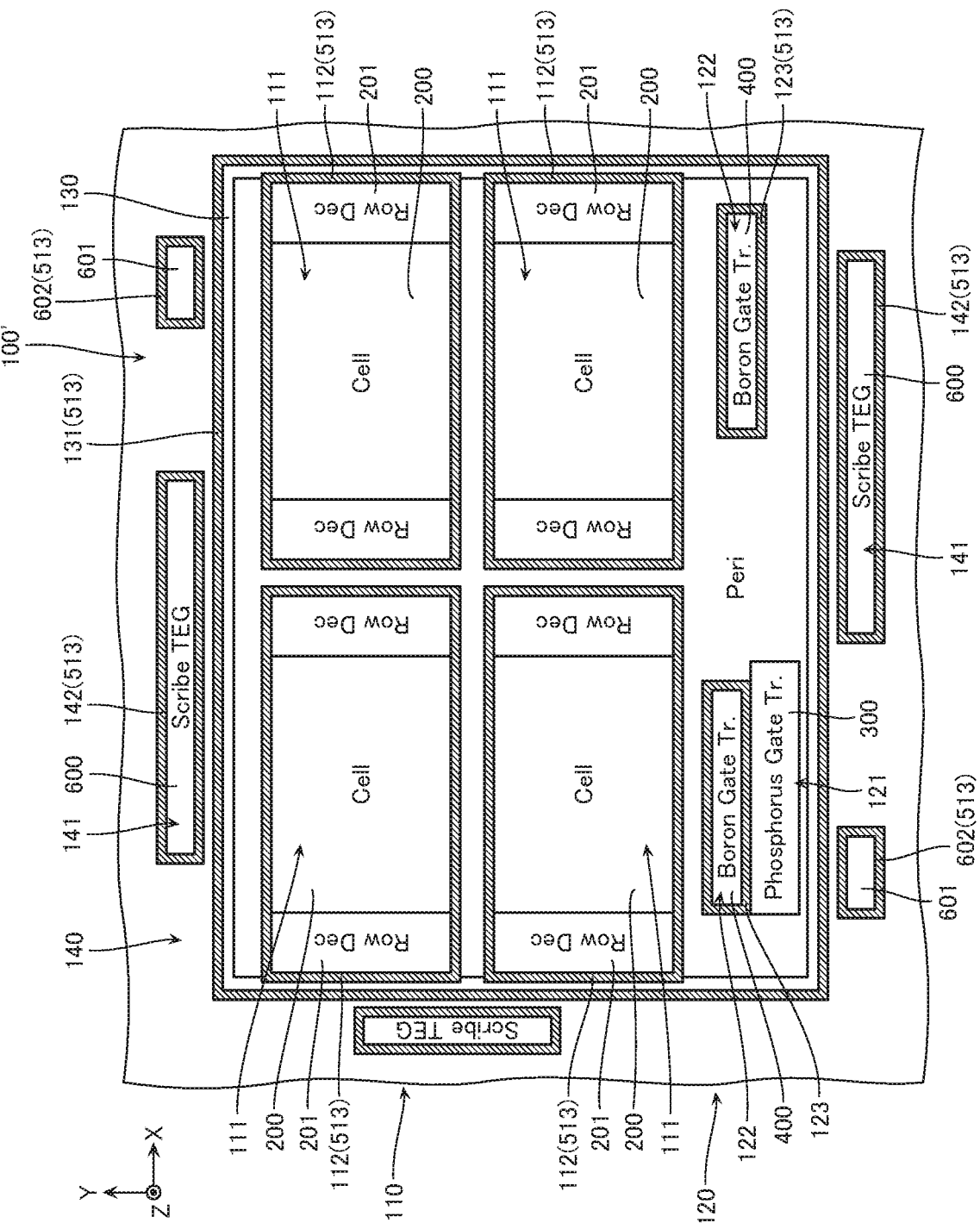
FIG. 6 is a schematic plan view for describing the semiconductor memory device according to the first embodiment.

Incidentally, as illustrated in FIG. 6, on a wafer 100' before being diced, there are provided a region which becomes the semiconductor substrate 100, and a dicing region 140 which extends along the outer edge of this region and surrounds this region. In the dicing region 140, a small region 141 and a dummy cell array 601 are provided. A test circuit 600 is provided in the small region 141, and the above described boron gate transistor 400 is provided also in this test circuit 600. In addition, in the dicing region 140, a plurality of guard ring regions 142 are provided. The plurality of guard ring regions 142 extend along the outer edges of the small regions 141 and surround the small regions 141, respectively. The dummy cell array 601 has substantially the same configuration as the memory cell array 200, but is smaller than the memory cell array 200. In addition, in the dicing region 140, a plurality of guard ring regions 602 are provided. The plurality of guard ring regions 602 extend along the outer edges of the dummy cell arrays 601 and surround the dummy cell arrays 601, respectively.

Figure 2:
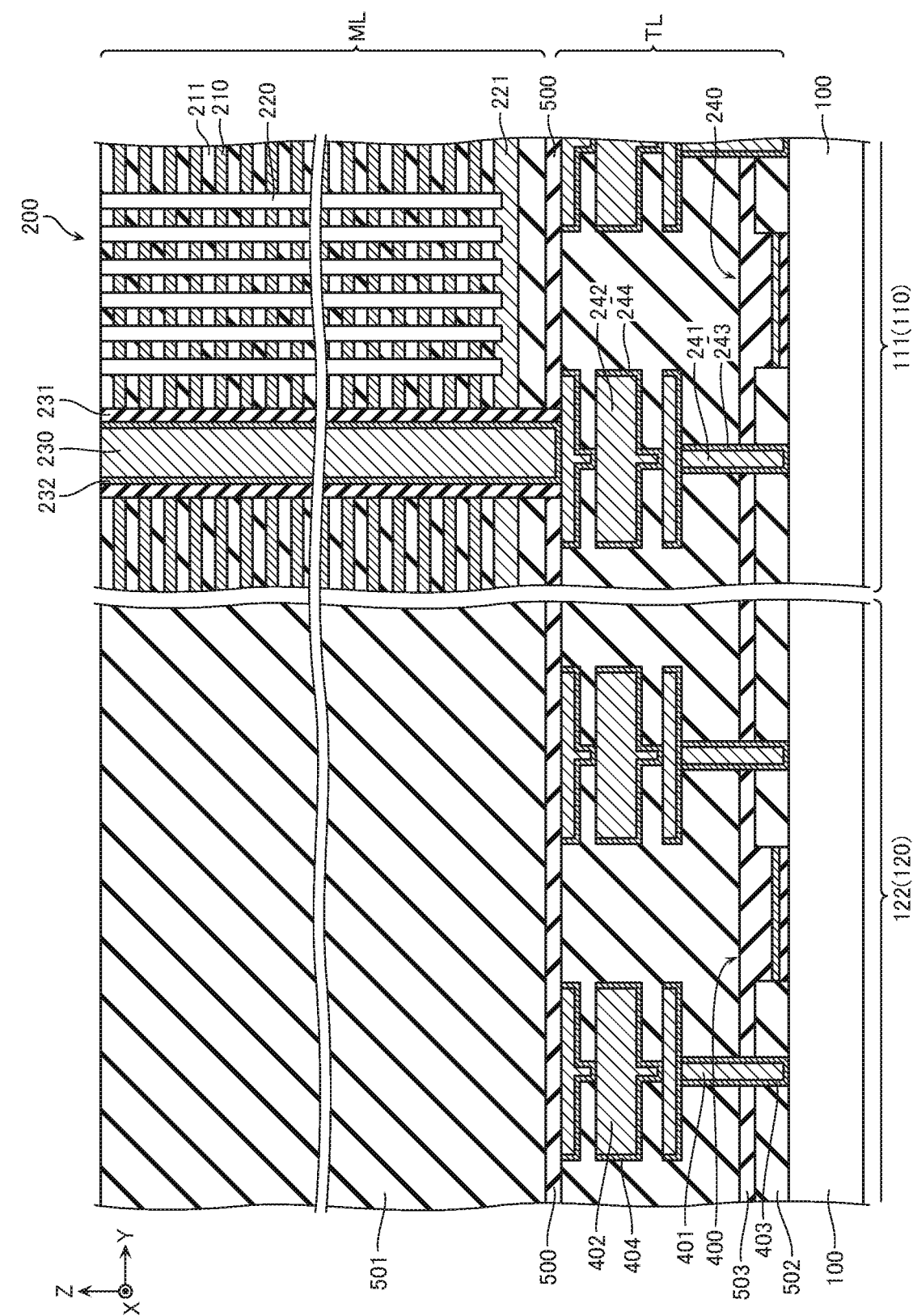
FIG. 2 is a schematic cross-sectional view of the same semiconductor memory device.

FIG. 2 is a schematic YZ cross-sectional view showing a part of the small region 111 of the memory cell array region 110 and a part of the small region 122 of the peripheral region 120. A part of the configuration is omitted in FIG. 2.

Above the semiconductor substrate 100, there are provided a memory layer ML which includes the memory cell array 200, and a transistor layer TL which is provided below the memory layer ML. In addition, a barrier insulating film 500 such as silicon nitride ($Si_3N_4$) is provided between the memory layer ML and the transistor layer TL.

In the memory cell array region 110 of the memory layer ML, the memory cell array 200 is provided. The memory cell array 200 includes: a plurality of conductive layers 210 and insulating layers 211 which are laminated in the Z direction; a plurality of memory structures 220 which penetrate the plurality of conductive layers 210 and the insulating layers 211 and extend in the Z direction; a wire 221 which is connected to the lower end of the memory structure 220; and a contact 230 which extends in the Z direction.

The conductive layers 210 function as control gate electrodes for a plurality of memory cells which are disposed in the X direction and the Y direction, and wires which are connected to the plurality of control gate electrodes, respectively. The conductive layer 210 is a substantially plate-like conductive layer including, for example, a barrier metal film such as titanium nitride (TiN) and a metal film such as tungsten (W). The insulating layer 211 is, for example, an insulating layer such as silicon oxide ($SiO_2$).

The memory structure 220 includes a cylindrical semiconductor layer, a charge accumulation portion provided between the semiconductor layer and the control gate electrode, and an insulating film provided therebetween, all of which extend in the Z direction. The semiconductor layer is a semiconductor layer, for example, such as polycrystalline silicon (p-Si), and functions as a channel region of a plurality of memory cells disposed in the Z direction. The charge accumulation portion is an insulating film which can store charges, for example, such as silicon nitride; a conductive film; or a semiconductor film. The insulating film provided therebetween is, for example, an insulating film of silicon oxide or the like.

The contact 230 is connected to the conductive layer 210, the memory structure 220, the wire 221 and the like, via unillustrated another contact, a wire and the like. In addition, the contact 230 penetrates the plurality of conductive layers 210 and insulating layers 211, penetrates the barrier insulating film 500, and is connected to the wire 242. An insulating layer 231 of silicon oxide or the like is provided between the contact 230 and the conductive layer 210. In addition, a barrier metal film 232 of titanium nitride or the like is provided between the contact 230 and the insulating layer 231.

In the memory cell array region 110 of the transistor layer TL, there are provided a field effect type transistor 240, and a plurality of contacts 241 and wires 242 which connect the transistor 240 to the contact 230. The transistor 240 includes, for example, a semiconductor layer including a part of the semiconductor substrate 100, a gate electrode provided between the semiconductor substrate 100 and the memory cell array 200, and a gate insulating film provided between the semiconductor substrate 100 and the gate electrode; and functions as a part of a row decoder 201 (FIG. 1) and the like. A barrier metal film 243 and a barrier metal film 244 are provided on side surfaces and lower surfaces in the X and Y directions of the contact 241 and the wire 242, respectively.

In the peripheral region 120 of the transistor layer TL, there are provided a plurality of field effect type boron gate transistors 400 including a part of the semiconductor substrate 100, and a plurality of contacts 401 and wires 402 which connect these boron gate transistors 400 to the gate electrode and the like of the transistor 240. A barrier metal film 403 and a barrier metal film 404 are provided on side surfaces and lower surfaces in the X and Y directions of the contact 401 and the wire 402, respectively.

In addition, an interlayer insulating layer 501 of silicon oxide or the like is provided between these configurations.

Figure 3:
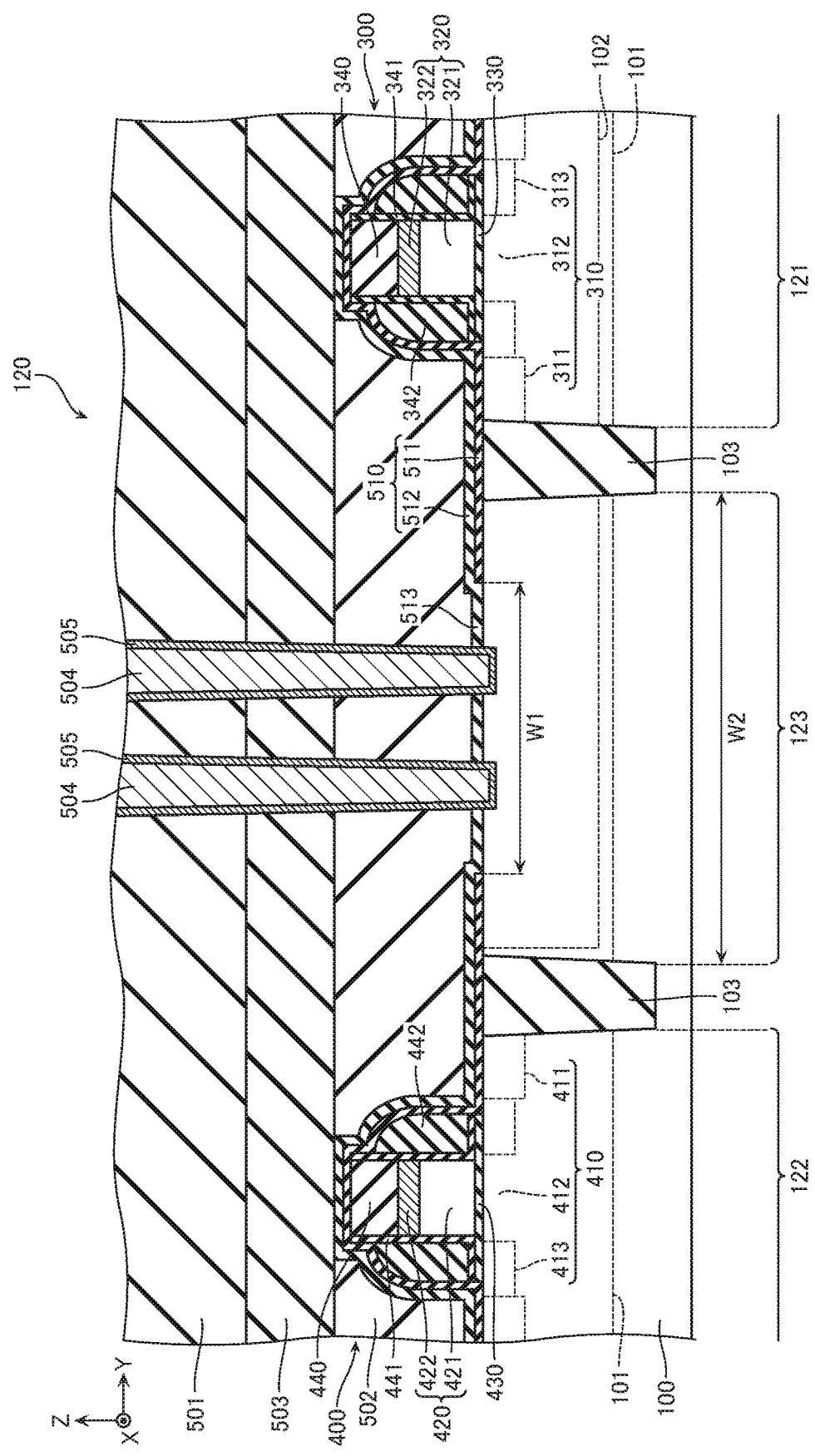
FIG. 3 is a schematic cross-sectional view of the same semiconductor memory device.

FIG. 3 is a schematic YZ cross-sectional view showing a configuration of a boundary portion between the small region 121 and the small region 122 in the peripheral region 120. A part of the configuration is omitted in FIG. 3.

As shown in FIG. 3, a phosphorus gate transistor 300 and a boron gate transistor 400 are provided on the semiconductor substrate 100. In addition, the semiconductor substrate 100, the phosphorus gate transistor 300 and the boron gate transistor 400 are covered with an insulative laminated film 510. In addition, an interlayer insulating layer 502 of silicon oxide or the like is provided between these configurations. Furthermore, a barrier insulating film 503 of silicon nitride or the like is provided between these configurations and the interlayer insulating layer 501. Furthermore, in the guard ring region 123, a contact 504 is provided which penetrates the interlayer insulating layer 501, the barrier insulating film 503, the interlayer insulating layer 502 and the laminated film 510, extends in the Z direction, and is connected to the semiconductor substrate 100. A barrier metal film 505 is provided on an outer peripheral surface and a lower surface of the contact 504. Incidentally, the contact 504 can be omitted.

On the semiconductor substrate 100, an N well 101 is provided which contains an N-type impurity such as phosphorus (P) and functions as an N-type semiconductor. In addition, on the N well 101, a P well 102 is provided which contains a P-type impurity such as boron (B) and functions as a P-type semiconductor. Furthermore, on the semiconductor substrate 100, there is provided an STI 103 of silicon oxide or the like, which divides the N well 101 and the P well 102. In the small region 121 and the like, on which the phosphorus gate transistor 300 is provided, the surface of the semiconductor substrate 100 is a part of the P well 102. In addition, in the small region 122 and the like, on which the boron gate transistor 400 is provided, the surface of the semiconductor substrate 100 is a part of the N well 101. In addition, in the guard ring region 123, the surface of the semiconductor substrate 100 is a part of the N well 101 or the P well 102, or is a part of the surface of the semiconductor substrate 100 on which the N well 101, the P well 102 and also the STI are not provided. Hereafter, among the surfaces of the semiconductor substrate 100, portions corresponding to the N well 101 and the P well 102, and a portion in which the N well 101, the P well 102 and also the STI are not provided are sometimes referred to as a "semiconductor portion". In addition, a portion corresponding to the STI is sometimes referred to as the "insulating portion".

For example, the phosphorus gate transistor 300 of the present embodiment includes a semiconductor layer 310, a gate electrode 320, and a gate insulating film 330 which is provided therebetween.

The semiconductor layer 310 includes a part of the P well 102 which is provided on the surface of the semiconductor substrate 100. The semiconductor layer 310 includes two impurity diffusion regions 311, a channel region 312 which is provided between these two impurity diffusion regions 311, and extension regions 313 which are provided between the impurity diffusion regions 311 and the channel region 312, respectively.

The impurity diffusion region 311 contains an N-type impurity such as phosphorus, and functions as an N-type semiconductor. The impurity diffusion region 311 functions as a source region or a drain region of the phosphorus gate transistor 300, and is connected to an unillustrated contact.

The channel region 312 functions as a P-type semiconductor. The channel region 312 faces the gate electrode 320.

The extension region 313 contains an N-type impurity such as phosphorus, and functions as an N-type semiconductor. However, a concentration of the N-type impurity in the extension region 313 is lower than a concentration of the N-type impurity in the impurity diffusion region 311.

The gate electrode 320 includes a semiconductor layer 321 and a metal layer 322 which are laminated on the gate insulating film 330. The semiconductor layer 321 is a semiconductor layer having electroconductivity, for example, such as a polycrystalline silicon. A main impurity of the gate electrode 320 is an N-type impurity such as phosphorus. Incidentally, in the present embodiment, the semiconductor layer 321 may contain boron or may not contain boron. In addition, the semiconductor layer 321 sometimes contains hydrogen (H). The metal layer 322 is, for example, a laminated film of titanium nitride and tungsten.

The gate insulating film 330 includes, for example, silicon oxide, alumina ($Al_2O_3$), hafnium oxide ($HfO_2$), or the like.

In addition, a cap insulating film 340 of silicon nitride or the like is provided on an upper surface of the gate electrode 320. Furthermore, an insulating film 341 of silicon nitride or the like, and a sidewall insulating film 342 of a silicon oxide or the like are provided on an upper surface of the gate insulating film 330, side surfaces in the Y direction of the gate electrode 320, and side surfaces in the Y direction of the cap insulating film 340.

For example, the boron gate transistor 400 of the present embodiment includes a semiconductor layer 410, a gate electrode 420, and a gate insulating film 430 which is provided therebetween.

The semiconductor layer 410 includes a part of the N well 101 which is provided on the surface of the semiconductor substrate 100. The semiconductor layer 410 includes two impurity diffusion regions 411, a channel region 412 which is provided between these two impurity diffusion regions 411, and extension regions 413 which are provided between the impurity diffusion region 411 and the channel region 412, respectively.

The impurity diffusion region 411 contains a P-type impurity such as boron, and functions as a P-type semiconductor. The impurity diffusion region 411 functions as a source region or a drain region of the boron gate transistor 400, and is connected to an unillustrated contact.

The channel region 412 functions as an N-type semiconductor. The channel region 412 faces the gate electrode 420.

The extension region 413 contains a P-type impurity such as boron, and functions as a P-type semiconductor. However, a concentration of the P-type impurity in the extension region 413 is lower than a concentration of the P-type impurity in the impurity diffusion region 411.

The gate electrode 420 includes a semiconductor layer 421 and a metal layer 422 which are laminated on the gate insulating film 430. The semiconductor layer 421 is a semiconductor layer having electroconductivity, for example, such as a polycrystalline silicon. A main impurity of the gate electrode 420 is a P-type impurity such as boron. Incidentally, in the present embodiment, the concentration of boron in the semiconductor layer 421 is at least higher than the concentration of boron in the semiconductor layer 321. In addition, the concentration of hydrogen in the semiconductor layer 421 is at least lower than the concentration of hydrogen in the semiconductor layer 321. The metal layer 422 is, for example, a laminated film of titanium nitride and tungsten.

The gate insulating film 430 includes, for example, silicon oxide, alumina, hafnium oxide, or the like. The gate insulating film 430 has a film thickness of, for example, 5 nm or less.

In addition, a cap insulating film 440 of silicon nitride or the like is provided on an upper surface of the gate electrode 420. Furthermore, an insulating film 441 of silicon nitride or the like, and a sidewall insulating film 442 of a silicon oxide or the like are provided on an upper surface of the gate insulating film 430, side surfaces in the Y direction of the gate electrode 420, and side surfaces in the Y direction of the cap insulating film 440.

The laminated film 510 is provided on the surface of the semiconductor substrate 100, side surfaces in the Y direction of the sidewall insulating film 342 of the phosphorus gate transistor 300, and an upper surface of the cap insulating film 340; and on side surfaces in the Y direction of the sidewall insulating film 442 of the boron gate transistor 400 and an upper surface of the cap insulating film 440. The laminated film 510 includes a first insulating film 511, and a second insulating film 512 which is laminated onto the first insulating film 511.

The second insulating film 512 is an insulating film having a diffusion coefficient of hydrogen smaller than that of the first insulating film 511. For example, when the first insulating film 511 is an insulating film of silicon oxide or the like, the second insulating film 512 may be an insulating film of silicon nitride or the like. In addition, for example, when both of the first insulating film 511 and the second insulating film 512 contain oxygen (O), the concentration of oxygen in the first insulating film 511 may be higher than the concentration of oxygen in the second insulating film 512. Furthermore, for example, when both of the first insulating film 511 and the second insulating film 512 contain nitrogen (N), the concentration of nitrogen in the second insulating film 512 may be higher than the concentration of nitrogen in the first insulating film 511. In addition, for example, the first insulating film 511 may contain silicon (Si) and oxygen as a main component, and the second insulating film 512 may contain silicon and nitrogen as a main component. In addition, the second insulating film 512 may be such an insulating film of alumina or the like as not to contain nitrogen.

In addition, the second insulating film 512 includes a first portion 513 which is in contact with a semiconductor portion (N well 101, P well 102 or the like) on the surface of the semiconductor substrate 100. The first portion 513 is provided in the guard ring region 123. In addition, as illustrated in FIG. 1, this first portion 513 extends along the outer edge of the small region 122, and surrounds the small region 122.

Incidentally, as illustrated in FIG. 1, this first portion 513 is provided not only in the guard ring region 123 but also in the guard ring regions 112 and 131. The first portion 513 provided in the guard ring region 112 extends along the outer edge of the small region 111, and surrounds the small region 111. Similarly, the first portion 513 provided in the guard ring region 131 extends along the outer edge of the surface of the semiconductor substrate 100, and surrounds the memory cell array region 110 and the peripheral region 120.

In addition, as illustrated in FIG. 6, in the state before dicing, the first portion 513 is provided also in the guard ring regions 142 and 602. The first portion 513 provided in the guard ring region 142 extends along the outer edge of the small region 141, and surrounds the small region 141. Similarly, the first portion 513 provided in the guard ring region 602 extends along the outer edge of the dummy cell array 601, and surrounds the dummy cell array 601.

Comparative Example

Figure 4:
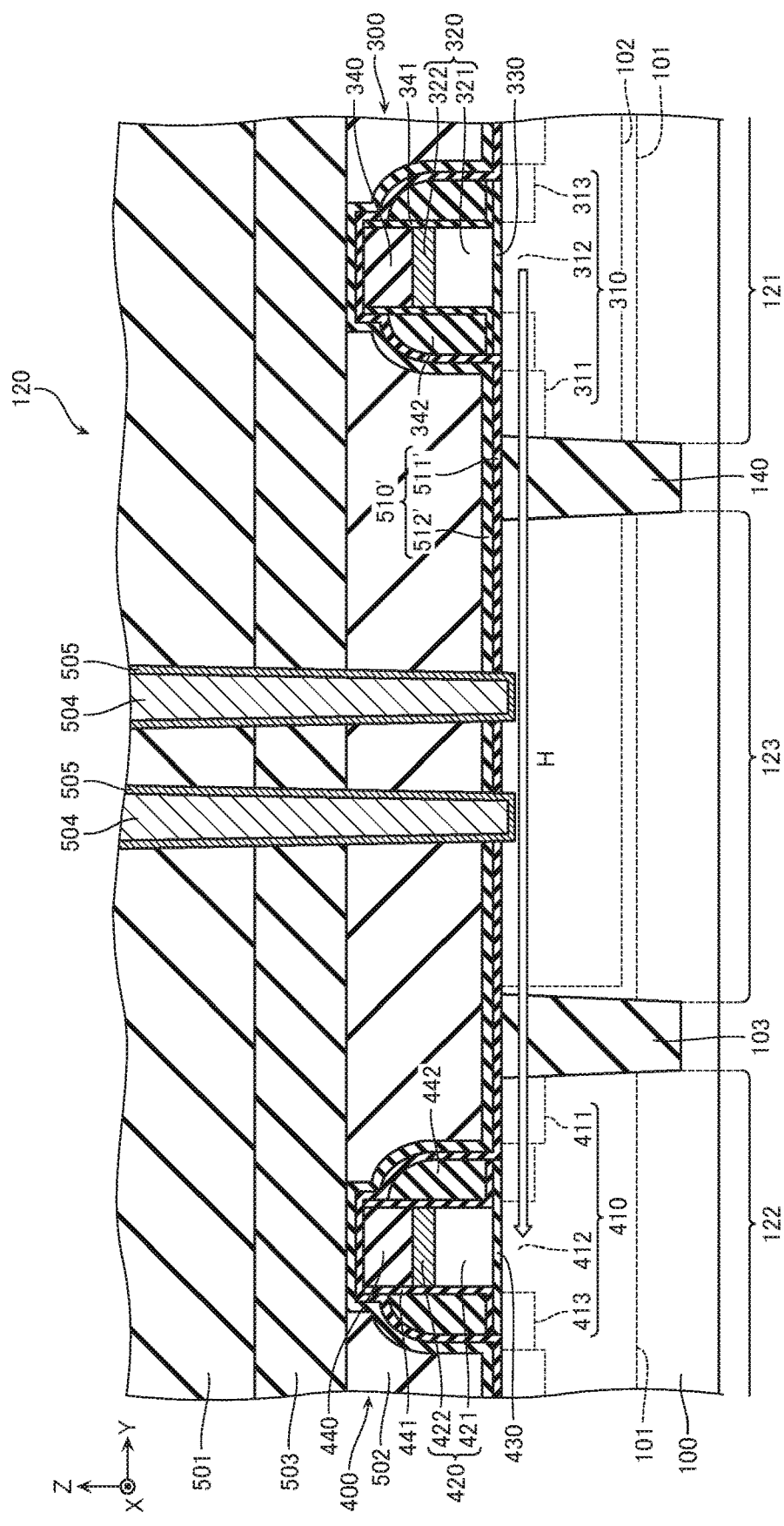
FIG. 4 is a schematic cross-sectional view of a semiconductor memory device according to a comparative example.

Next, a configuration of a semiconductor memory device according to a comparative example will be described with reference to FIG. 4. FIG. 4 is a schematic cross-sectional view showing the configuration of the semiconductor memory device according to the comparative example. In FIG. 4, a part of the configuration is omitted.

As illustrated in FIG. 4, the semiconductor memory device according to the comparative example is basically configured similarly to that of the first embodiment. However, a second insulating film 512' of a laminated film 510' according to the comparative example does not have the above described first portion 513. That is, a first insulating film 511' of the laminated film 510' covers the surface of the semiconductor substrate 100 also in the guard ring region 123.

[Defect of Boron Gate Transistor 400]

In the semiconductor memory device according to the comparative example, the boron gate transistor 400 has been sometimes defective. As a result of investigation by the inventors, it has been understood that in such a boron gate transistor 400, boron in the semiconductor layer 421 of the gate electrode 420 sometimes diffuses to the semiconductor layer 410 through the gate insulating film 430. In addition, there has been a tendency that the higher the concentration of hydrogen in the semiconductor layer 421 or the gate insulating film 430 is, more easily such diffusion of boron occurs. Accordingly, in order to suppress the defect of the boron gate transistor 400, it is considered to suppress the diffusion of hydrogen to the semiconductor layer 421.

Figure 5:
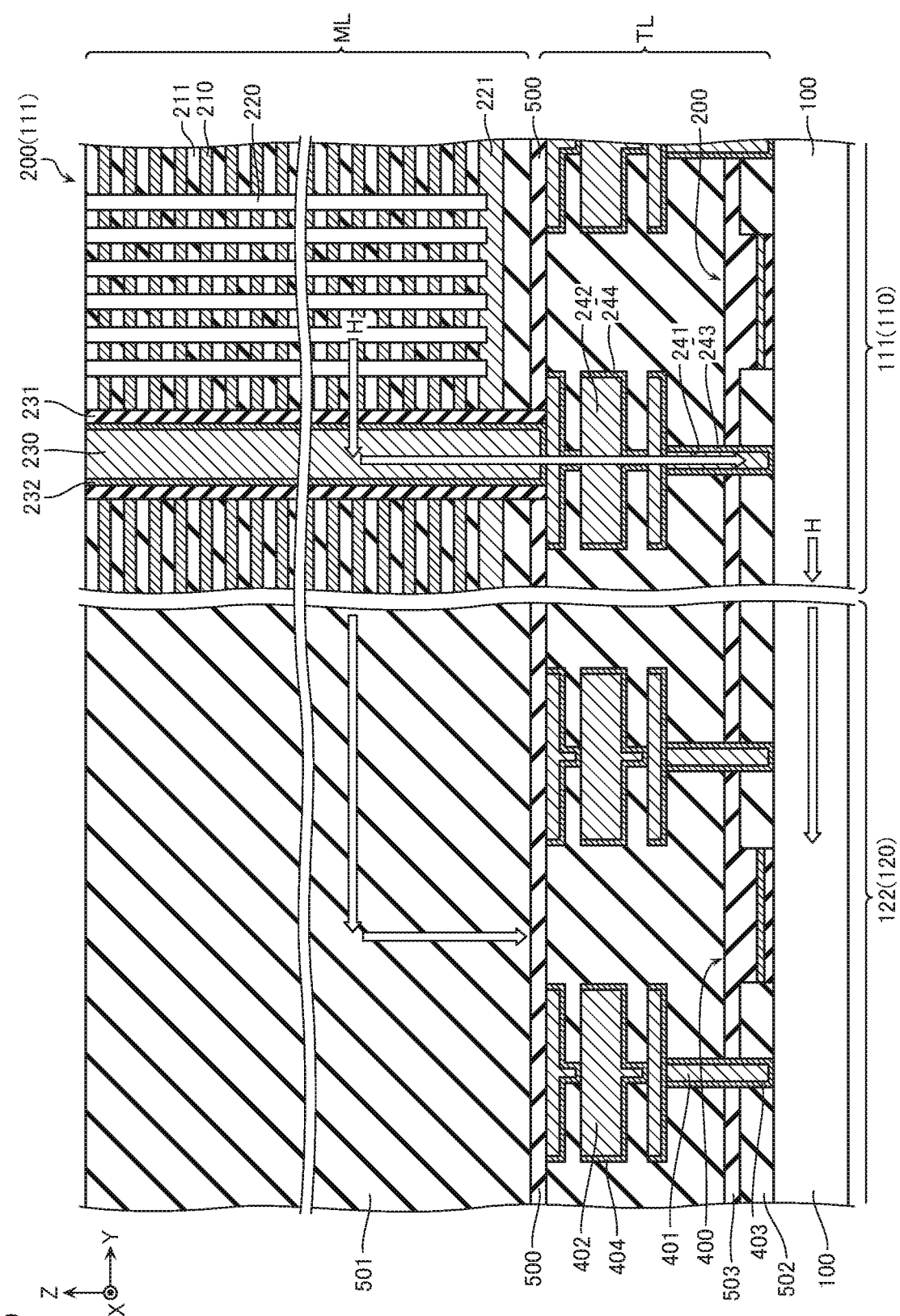
FIG. 5 is a schematic cross-sectional view of the same semiconductor memory device.

Here, as illustrated in FIG. 5, the memory cell array 200 includes the plurality of conductive layers 210 and insulating layers 211 which are alternately laminated in the Z direction. These layers are formed with the use of a method such as CVD (Chemical Vapor Deposition). In such a case, hydrogen sometimes remains in these portions. In addition, this hydrogen sometimes diffuses in a heating step.

Here, a barrier insulating film 500 of silicon nitride or the like, the diffusion coefficient of hydrogen of which is low, is provided between the memory layer ML and the transistor layer TL. Accordingly, the diffusion of hydrogen from the memory layer ML to the transistor layer TL is suppressed to some extent. However, hydrogen in the memory layer ML sometimes diffuses to the contact 241 and the wire 242 of the transistor layer TL along the contact 230 which penetrates the barrier insulating film 500.

In addition, a barrier metal film 243 and a barrier metal film 244 of titanium nitride or the like, the diffusion coefficient of hydrogen of which is small, are provided on the lower surfaces and the side surfaces of the contact 241 and the wire 242, respectively. Accordingly, the diffusion of hydrogen from the contact 241 and the wire 242 is suppressed to some extent.

However, for example, as illustrated in the drawing, an upper surface of a part of the wire 242 is sometimes in contact with the interlayer insulating layer 501; and in this case, hydrogen in the wire 242 diffuses into the interlayer insulating layer 501, and further sometimes diffuses into the wire 402. However, it is considered that hydrogen substantially uniformly diffuses in the interlayer insulating layer 501, and accordingly it is considered that hydrogen diffusing in the wire 402 is an extremely small part of the hydrogen which has diffused into the interlayer insulating layer 501.

On the other hand, hydrogen in the contact 241 sometimes passes through the barrier metal film 243 and diffuses into the first insulating film 511' of the laminated film 510', depending on the amount of hydrogen, the form of the heating step or the like. Here, the contact 241 is positioned right under the contact 230, and accordingly there is a possibility that a relatively large amount of hydrogen diffuses into the contact 241.

In addition, as illustrated in FIG. 4, there is a possibility that hydrogen in the first insulating film 511' passes through the first insulating film 511' and diffuses to the gate electrode 420 of the boron gate transistor 400.

[Effect of First Embodiment]

As described with reference to FIG. 3, in the first embodiment, the second insulating film 512 of silicon nitride or the like has a first portion 513 which is in contact with the semiconductor portion on the surface of the semiconductor substrate 100. In addition, as described with reference to FIG. 1, this first portion 513 surrounds the small region 122. Here, the diffusion coefficients of hydrogen in single crystal silicon and silicon nitride are smaller than the diffusion coefficient of hydrogen in silicon oxide or the like. Accordingly, by the first portion 513 surrounding the small region 122, it is possible to divide the region in which the memory cell array 200 is provided and the region in which the boron gate transistor 400 is provided, and to suitably suppress the diffusion of hydrogen into the region in which the boron gate transistor 400 is provided. Thereby, it is possible to suppress the diffusion of hydrogen into the gate electrode 420 of the boron gate transistor 400, and to suitably suppress the defect of the boron gate transistor 400.

Here, in order to suitably suppress the defect of the boron gate transistor 400, it is desirable that the width W1 (FIG. 3) of the first portion 513 of the second insulating film 512 is large. In addition, in relation to the manufacturing process, it is desirable that the width W2 (FIG. 3) of the guard ring region 123 itself is larger than the width W1 of the first portion 513. On the other hand, from the viewpoint of the high levels of integration, it is desirable that the increment of the circuit area caused by the increase of the guard ring region 123 or the like is small.

In this respect, as illustrated in FIG. 1, the guard ring region 123 extends along the outer edge of the small region 122 in which the boron gate transistor 400 is provided, and surrounds the small region 122. Accordingly, it is possible to suppress the diffusion of hydrogen in the vicinity of the small region 122 into the small region 122. In addition, as compared to the case, for example, where a guard ring region covering the entire peripheral region 120 is provided, it is sometimes possible to suppress the increment of the circuit area. In addition, the guard ring region 123 is provided outside the memory cell array region 110 in which the memory cell array 200 is provided. Accordingly, when hydrogen generated in the memory cell array 200 has substantially isotropically diffused, the concentration of hydrogen in the vicinity of the small region 122 becomes lower than the concentration of hydrogen in the memory cell array region 110. Accordingly, it is possible to effectively suppress the diffusion of hydrogen into an inside of the small region 122.

In addition, the guard ring region 112 surrounds the small region 111 in which the memory cell array 200 is provided. Accordingly, it is possible to suppress the diffusion of hydrogen to a region outside the small region 111, and to effectively suppress the diffusion of hydrogen to the small region 122 and the like.

In addition, the guard ring region 131 surrounds the memory cell array region 110 and the peripheral region 120. Accordingly, it is possible to suppress the diffusion of hydrogen from the outside to the peripheral region 120, and the diffusion of hydrogen from the memory cell array region 110 to the outside.

For example, as described with reference to FIG. 6, in the wafer 100' before dicing, the dummy cell array 601 is provided in the dicing region 140. The dummy cell array 601 has a similar configuration to that of the memory cell array 200, and hydrogen is generated also in the dummy cell array 601. According to the guard ring region 131, it is possible to suppress the diffusion of hydrogen generated in the dummy cell array 601 to the peripheral region 120.

In addition, as described with reference to FIG. 6, in the wafer 100' before dicing, a small region 141 is provided in the dicing region 140, and the test circuit 600 is sometimes provided in the small region 141. Furthermore, the test circuit 600 sometimes includes a transistor similar to the above described boron gate transistor 400. According to the guard ring region 131, it is possible to suppress the diffusion of hydrogen generated in the memory cell array 200 to the small region 141.

In addition, the guard ring region 142 surrounds the small region 141 in which the test circuit 600 is provided. Accordingly, it is possible to suppress the diffusion of hydrogen from the outside to the small region 141.

In addition, the guard ring region 602 surrounds the dummy cell array 601. Accordingly, it is possible to suppress the diffusion of hydrogen generated in the dummy cell array 601 to the peripheral region 120 and the small region 141 in which the test circuit 600 is provided.

Modified Example of First Embodiment

As described with reference to FIG. 1, the guard ring regions 123 surround a plurality of small regions 122 in which the P-channel type boron gate transistors 400 are provided, respectively. However, in a field effect type transistor having a gate electrode which contains boron, there is a possibility that boron in the gate electrode passes through a gate insulating film and diffuses to a semiconductor layer, similarly to the above described P-channel type boron gate transistors 400. Accordingly, in the small region 122 surrounded by the guard ring region 123, a transistor having a gate electrode which contains boron may be provided, irrespective of whether the transistor is a P-channel type or an N-channel type. Furthermore, even if boron is contained in the gate electrode, when the amount of boron is extremely small, the influence on the transistor is also considered to be limited. Accordingly, for example, when there are two transistors the gate electrodes of which have different concentrations of boron from each other, it is acceptable to provide a transistor the gate electrode of which has a higher concentration of boron, in the inside of the small region 122, and to provide a transistor the gate electrode of which has a lower concentration of boron, in the outside of the small region 122.

In addition, for example, on the semiconductor substrate 100, sometimes both of a voltage-resistant transistor which is used for voltage transfer and the like, and a low-voltage transistor which is used for controlling these transistors for voltage transfer are provided. In this case, for example, the film thickness of the gate insulating film in the low-voltage transistor is sometimes smaller than the film thickness of the gate insulating film in the voltage-resistant transistor. In such a case, the diffusion of hydrogen to the semiconductor layer tends to easily occur in the transistor the film thickness of which is smaller. In particular, when the film thickness of a gate insulating film is 5 nm or less, the diffusion of hydrogen to a semiconductor layer tends to easily occur. Accordingly, in order to reduce an area of the guard ring region 123, it is acceptable to provide a transistor having a film thickness of a gate insulating film larger than that of another transistor or a transistor having a film thickness of a gate insulating film larger than 5 nm, in the outside of the small region 122. Additionally, it is acceptable to provide a transistor having a film thickness of a gate insulating film smaller than that of another transistor or a transistor having a film thickness of a gate insulating film equal to or smaller than 5 nm, in the inside of the small region 122.

Second Embodiment

[Configuration]

Figure 7:
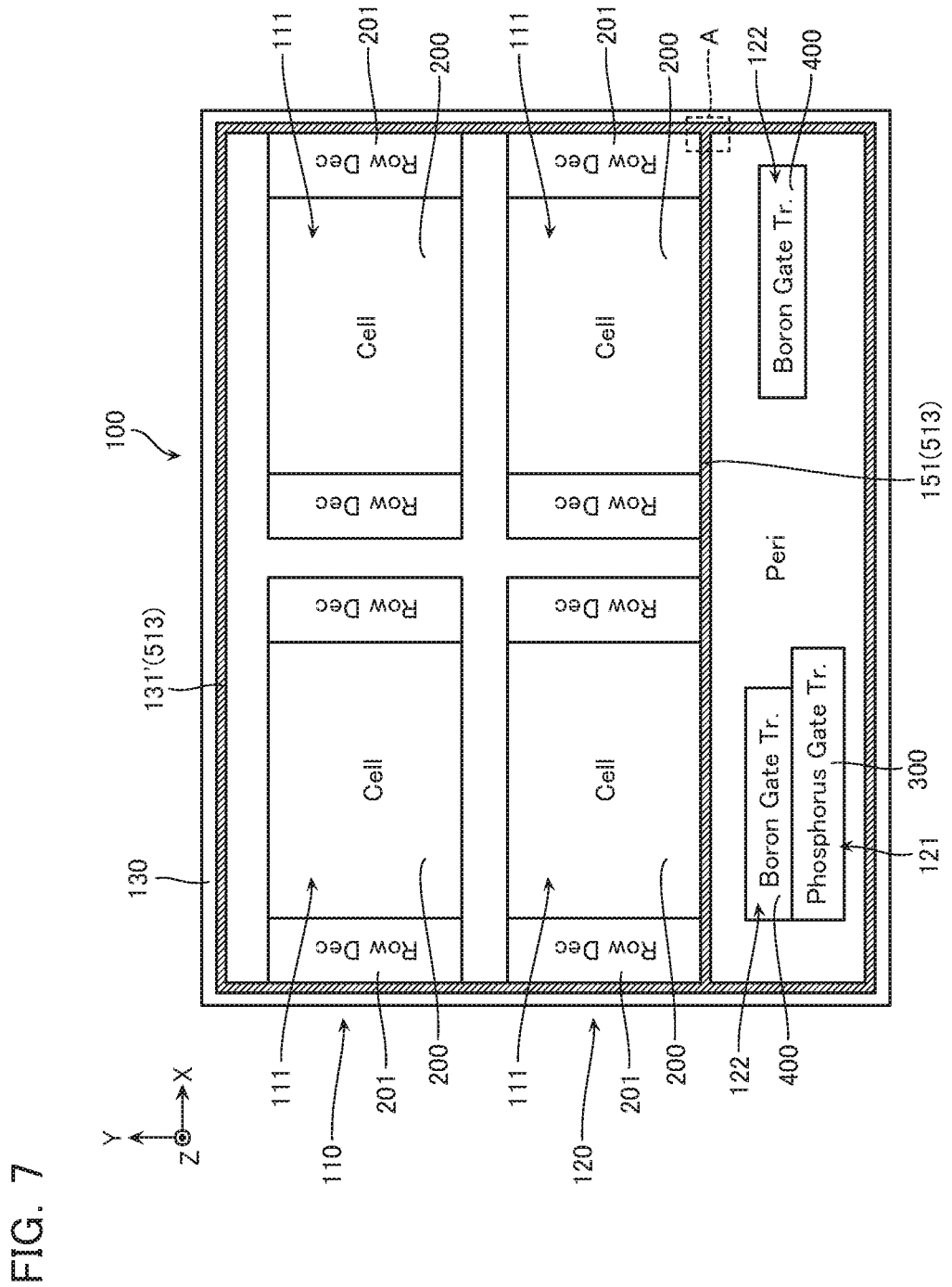
FIG. 7 is a schematic plan view of a semiconductor memory device according to a second embodiment.

FIG. 7 is a schematic plan view of a semiconductor memory device according to a second embodiment. For the convenience of explanation, a part of the configuration is omitted in FIG. 7. In addition, in the following description, the same reference numerals are given to similar portions to those in the first embodiment, and descriptions thereof will be omitted.

The semiconductor memory device according to the present embodiment is basically configured similarly to the semiconductor memory device according to the first embodiment, but the arrangement of the guard ring region differs. That is, the semiconductor memory device according to the present embodiment does not have the guard ring regions 112 and 123 (FIG. 1). The semiconductor memory device according to the present embodiment has a guard ring region 151 which is provided along a boundary portion between the memory cell array region 110 and the peripheral region 120, and extends in the X direction so as to partition the memory cell array region 110 and the peripheral region 120. Additionally, a guard ring region 131' according to the present embodiment is basically configured similarly to the guard ring region 131 (FIG. 1), but is connected to the guard ring region 151, and surrounds the memory cell array region 110 and the peripheral region 120 together with the guard ring region 151.

Incidentally, in the guard ring regions 151 and 131', similarly to the guard ring region 123 which has been described with reference to FIG. 3, the first portion 513 of the second insulating film 512 of the laminated film 510 is provided.

Figure 8:
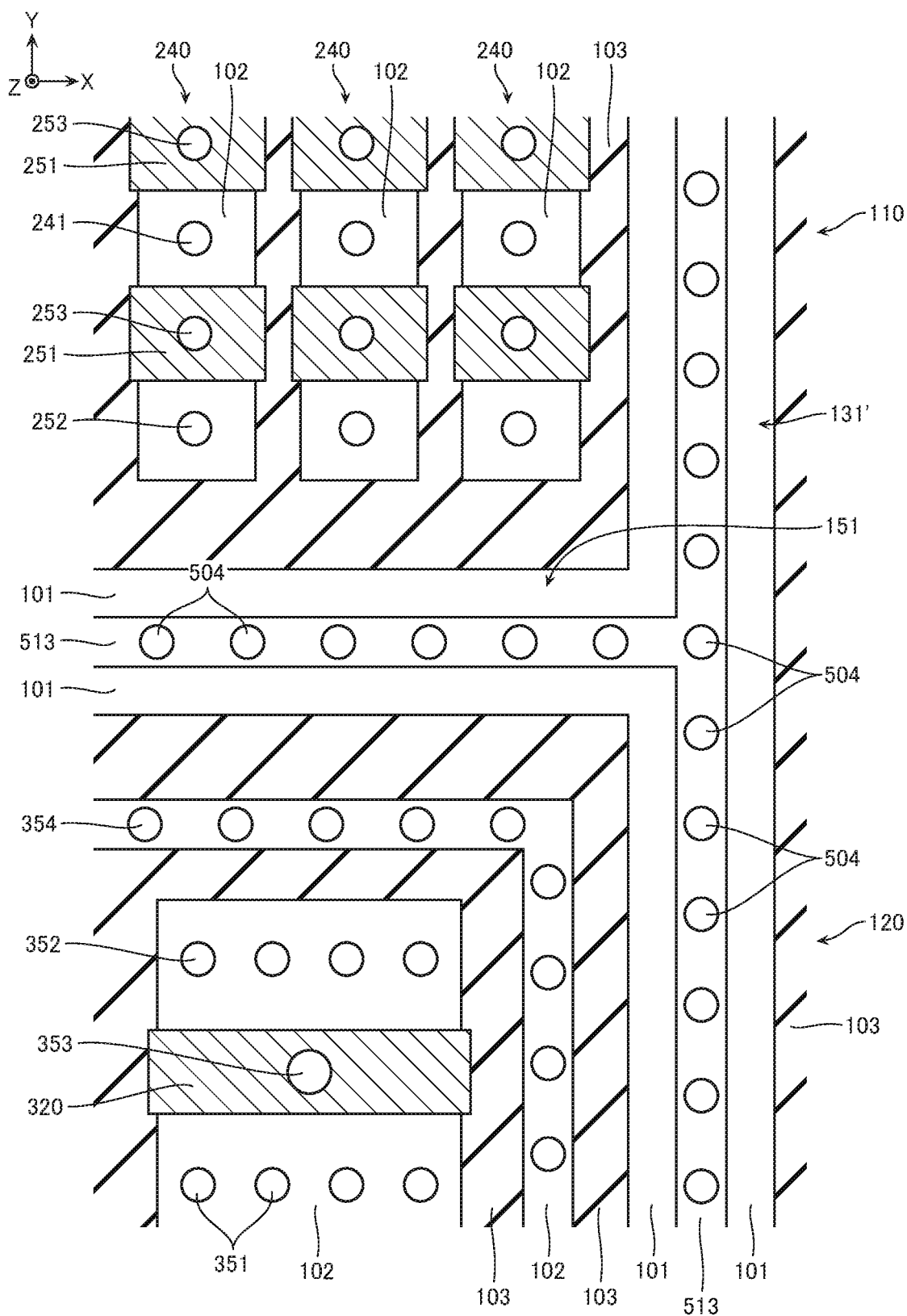
FIG. 8 is a schematic plan view of the same semiconductor memory device.

FIG. 8 is a schematic plan view showing a part of the surface of the semiconductor substrate 100, and corresponds to the region indicated by A in FIG. 7. For the convenience of explanation, a part of the configuration is omitted in FIG. 8.

FIG. 8 shows configurations of the memory cell array region 110, the peripheral region 120, the guard ring region 151 and the guard ring region 131'.

In the memory cell array region 110, a plurality of P wells 102 divided by the STI 103 are disposed. The plurality of P wells 102 constitute a part of the transistor 240 which has been described, for example, with reference to FIG. 2. In each of the plurality of P wells 102, a gate electrode 251 is provided via an unillustrated gate insulating film. In addition, the contact 241 (FIG. 2) and the contact 252 are provided in a part of the P well 102, and the contact 253 is provided on the gate electrode 251.

In the peripheral region 120, the P well 102 surrounded by the STI 103 is provided. The P well 102 constitutes a part of the phosphorus gate transistor 300 which has been described, for example, with reference to FIG. 3. On the P well 102, the gate electrode 320 is provided via the gate insulating film 330 (FIG. 3). In addition, a contact 351 and a contact 352 are provided on a part of the P well 102, and a contact 353 is provided on the gate electrode 320.

In the guard ring region 151, the N well 101 and the first portion 513 of the second insulating film 512 (FIG. 3) are provided. The N well 101 and the first portion 513 of the second insulating film 512 are provided along a boundary portion between the memory cell array region 110 and the peripheral region 120, and extend in the X direction so as to partition the memory cell array region 110 and the peripheral region 120. In the guard ring region 151, a plurality of contacts 504 are arranged in the X direction.

In the guard ring region 131', the N well 101 and the first portion 513 of the second insulating film 512 (FIG. 3) are provided. The N well 101 and the first portion 513 of the second insulating film 512 extend in the Y direction along the outer edge of the surface of the semiconductor substrate 100. In addition, in the guard ring region 131', a plurality of contacts 504 are arranged in the Y direction.

In addition, an end in the X direction of the N well 101 in the guard ring region 151 is connected to the N well 101 of the guard ring region 131'. Similarly, an end in the X direction of the first portion 513 of the guard ring region 151 is connected to the first portion 513 of the guard ring region 131'.

[Effect of Second Embodiment]

As described with reference to FIG. 7, the semiconductor memory device according to the second embodiment includes a guard ring region 151 which is provided along the boundary portion between the memory cell array region 110 and the peripheral region 120, and extends so as to partition the memory cell array region 110 and the peripheral region 120. In addition, the semiconductor memory device according to the present embodiment includes a guard ring region 131' which extends along the outer edge of the surface of the semiconductor substrate 100 and surrounds the memory cell array region 110 and the peripheral region 120. Such a configuration sometimes suppresses an increase in the circuit area, as compared to the case where a guard ring region which surrounds the memory cell array region 110 and the like and a guard ring region which surrounds the peripheral region 120 and the like are provided separately.

Modified Example of Second Embodiment

As described with reference to FIG. 7, the semiconductor memory device according to the second embodiment includes the guard ring region 131' which surrounds the memory cell array region 110 and the peripheral region 120, and the guard ring region 151 which extends so as to partition the memory cell array region 110 and the peripheral region 120, and a combination of these guard ring regions surrounds both the memory cell array region 110 and the peripheral region 120. However, it is also considered to omit, for example, a part of the guard ring region 131'.

Figure 9:
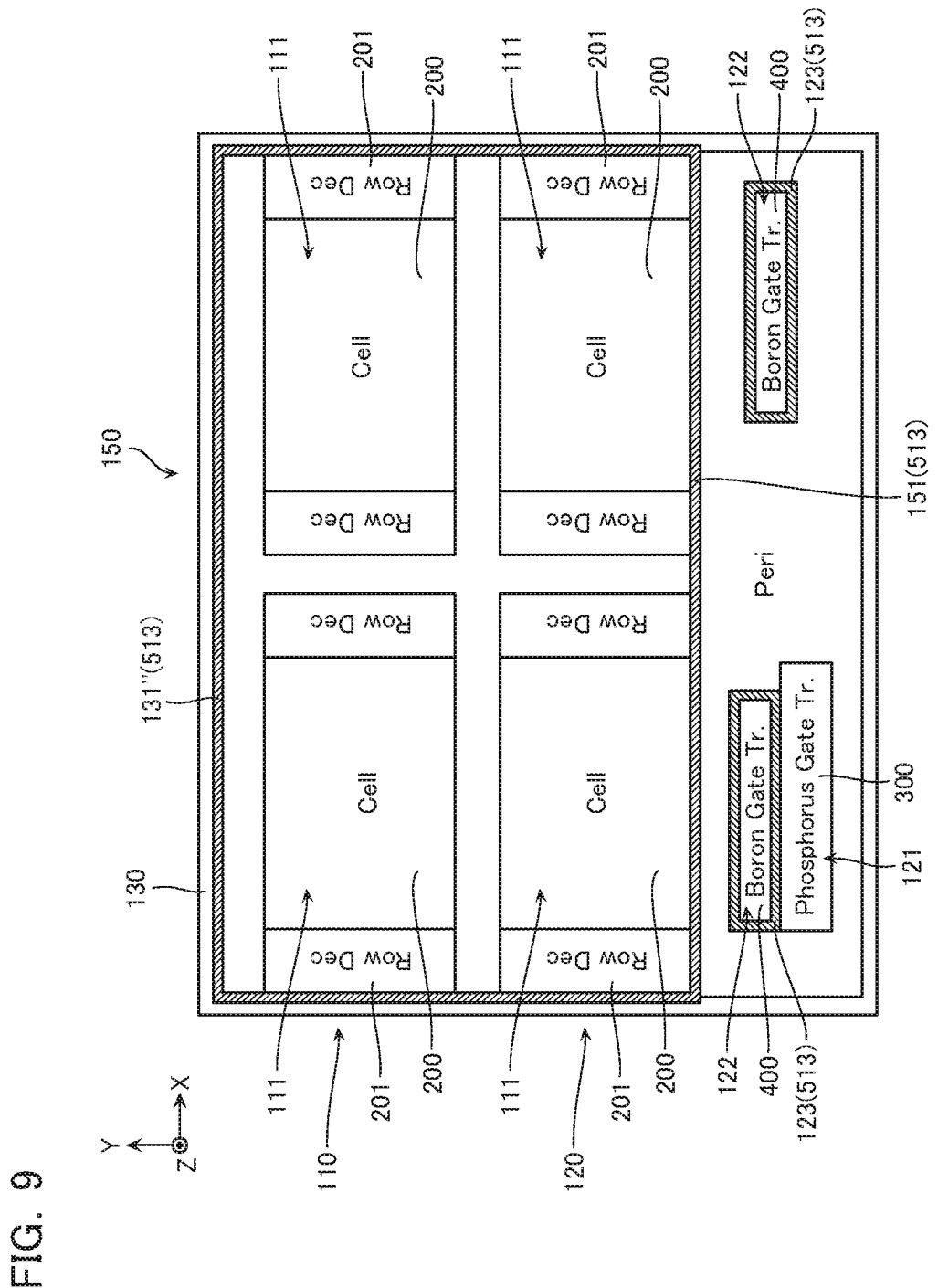
FIG. 9 is a schematic plan view of a semiconductor memory device according to a modified example.

For example, as illustrated in FIG. 9, it is also considered to omit a portion of the guard ring region 131' surrounding the peripheral region 120, and to provide a guard ring region 131" which surrounds the memory cell array region 110 together with the guard ring region 151. In this case, it is also acceptable to provide, for example, the guard ring region 123 described with reference to FIG. 1.

Figure 10:
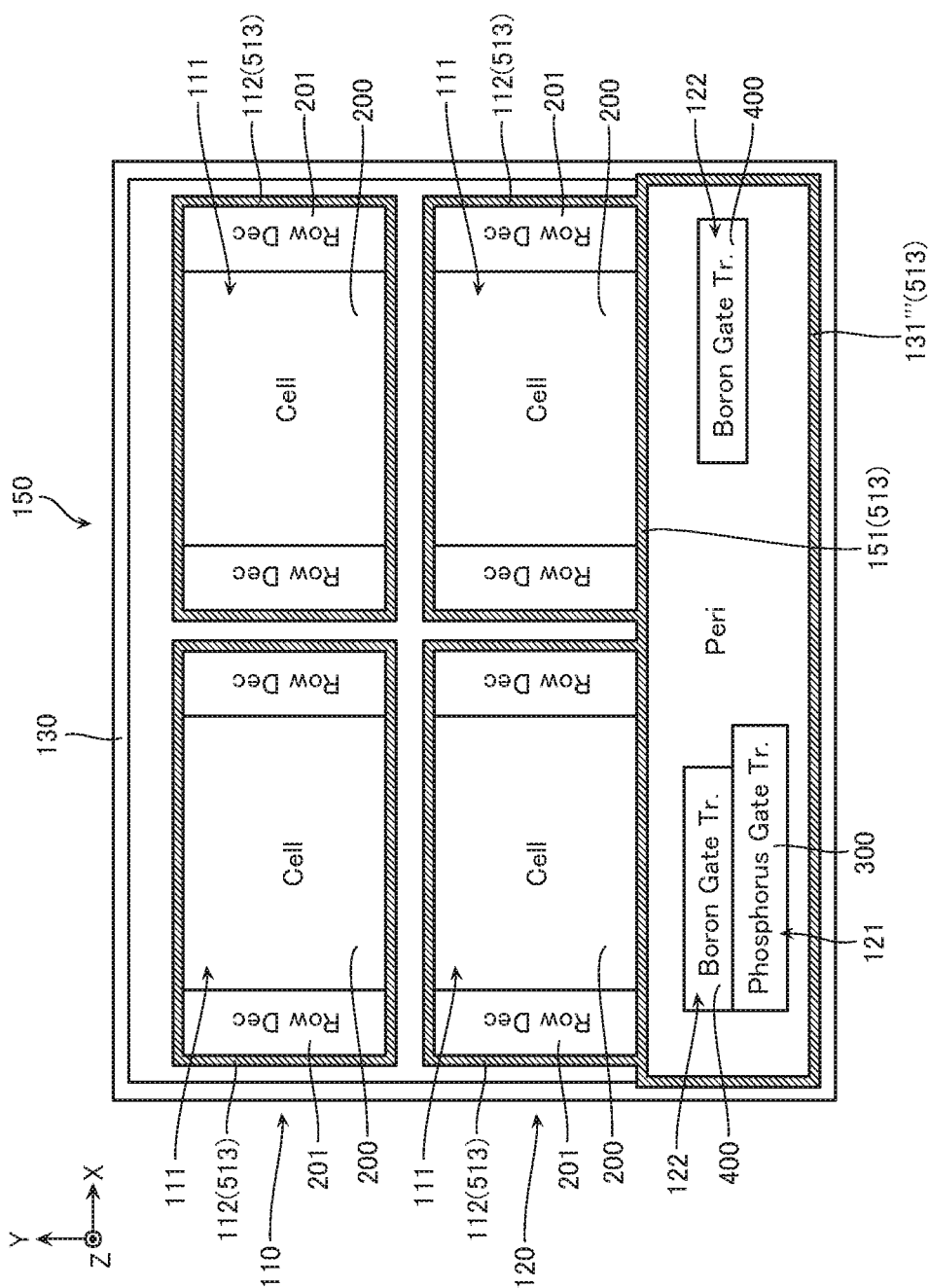
FIG. 10 is a schematic plan view of the semiconductor memory device according to the modified example.

In addition, for example, as illustrated in FIG. 10, it is also considered to omit the portion of the guard ring region 131' surrounding the memory cell array region 110, and to provide a guard ring region 131''' which surrounds the peripheral region 120 together with the guard ring region 151. In this case, it is also acceptable to provide, for example, the guard ring region 112 described with reference to FIG. 1. In addition, as illustrated, it is also acceptable to make a part of the guard ring region 112 be common with a part of the guard ring region 151.

Other Embodiments

Figure 11:
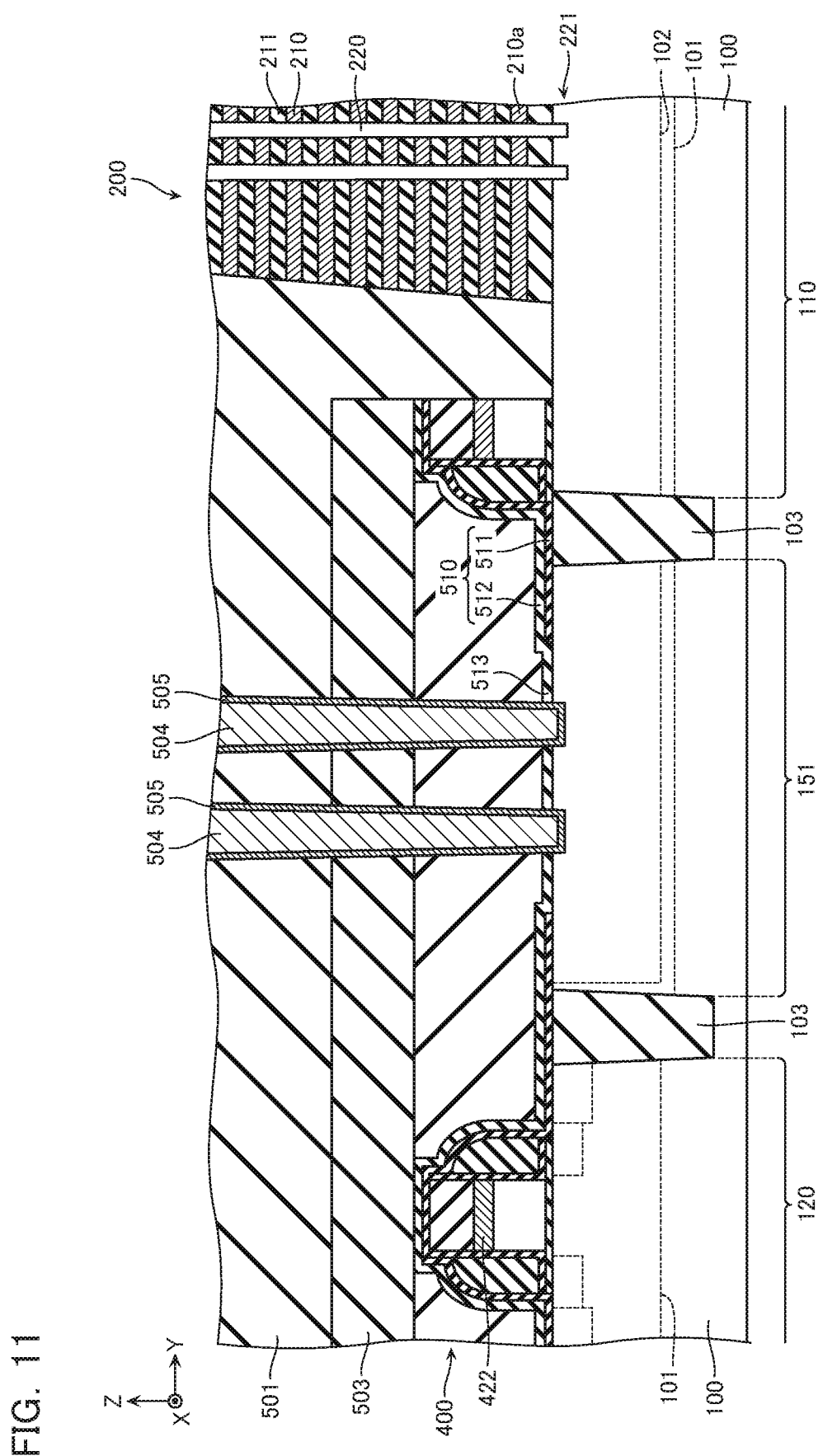
FIG. 11 is a schematic cross-sectional view of the semiconductor memory device according to the modified example.

As described with reference to FIG. 2 and the like, in the semiconductor memory devices according to the first and second embodiments, the transistor layer TL is provided below the memory layer ML. However, for example, as illustrated in FIG. 11, it is also acceptable not to provide the transistor layer TL below the memory layer ML. In the example shown in FIG. 11, the memory cell array 200 is provided on the surface of the semiconductor substrate 100. Here, in the example of FIG. 2, all the configurations contained in the memory cell array 200 are more apart from the semiconductor substrate 100 than all the configurations contained in the boron gate transistor 400 and the like. In contrast, in the example of FIG. 11, this point differs. For example, paying attention to the conductive layer closest to the surface of the semiconductor substrate 100 (210a in FIG. 11) among a plurality of conductive layers 210 contained in the memory cell array 200, the conductive layer 210a is closer to the semiconductor substrate 100 than the metal layer 422 contained in the boron gate transistor 400. In addition, the lower end of the memory structure 220 is connected to the P well 102 on the surface of the semiconductor substrate 100, and the surface of the semiconductor substrate 100 functions as a wire 221.

In such a structure, a semiconductor portion (P well 102 in the illustrated example) of the surface of the semiconductor substrate 100 is sometimes provided between the memory cell array region 110 and the peripheral region 120 so as to partition the memory cell array region 110 and the peripheral region 120. Accordingly, for example, by providing the guard ring region 151 (FIG. 7) according to the second embodiment in this region, an increase in the circuit area can be sometimes suppressed.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor substrate including a semiconductor portion and an insulating portion provided on a surface;
at least one memory cell array provided in at least one first region of the semiconductor substrate;
a first transistor provided in a second region of the semiconductor substrate;
a first insulating film covering the first transistor; and
a second insulating film that is in contact with the first insulating film, wherein
the first transistor comprises:
a first semiconductor layer;
a first gate electrode facing the first semiconductor layer; and
a first gate insulating film provided between the first semiconductor layer and the first gate electrode,
the second insulating film has a smaller diffusion coefficient of hydrogen (H) than the first insulating film, and
the second insulating film includes at least one first portion and a second portion in contact with the semiconductor portion, the at least one first portion extends along the at least one first region and the second portion extends along the second region and the second portion is provided outside of the at least one first portion, and
the at least one first portion surrounds the at least one first region and the second portion surrounds the second region.

2. A semiconductor memory device comprising:
a semiconductor substrate including a semiconductor portion and an insulating portion provided on a surface;
at least one memory cell array provided in at least one first region of the semiconductor substrate:
a first transistor provided in a second region of the semiconductor substrate;
a first insulating film covering the first transistor; and
a second insulating film that is in contact with the first insulating film, wherein
the first transistor comprises:
a first semiconductor layer;
a first gate electrode facing the first semiconductor layers; and
a first gate insulating film provided between the first semiconductor layer and the first gate electrode,
the second insulating film has a smaller diffusion coefficient of hydrogen (H) than the first insulating film,
the second insulating film includes at least one first portion and a second portion in contact with the semiconductor portion, the at least one first portion extends along the at least one first region and the second portion extends along the second region and the second portion is provided outside of the at least one first portion, and
the second portion extends along an outer edge of the semiconductor substrate.

3. The semiconductor memory device according to claim 1, wherein
the at least one first region comprises a plurality of first regions partitioned by the at least one first portion, and the second region is provided between two of the plurality of first regions.

4. The semiconductor memory device according to claim 1, further comprising:
at least one second transistor provided in the at least one first region; wherein
each of the at least one second transistor comprises:
a second semiconductor layer;
a second gate electrode facing the second semiconductor layer; and
a second gate insulating film provided between the second semiconductor layer and the second gate electrode, wherein
concentration of boron (B) in the first gate electrode is higher than concentration of boron in the second gate electrode.

5. The semiconductor memory device according to claim 1, wherein
the first insulating film includes silicon (Si) and oxygen (O), and
the second insulating film includes silicon and nitrogen (N).

6. The semiconductor memory device according to claim 4, further comprising:
a third region of the semiconductor substrate provided between the second portion and an edge of the semiconductor substrate; and
a third transistor provided in the third region, wherein
the third transistor comprises:
a third semiconductor layer;
a third gate electrode facing the third semiconductor layer; and
a third gate insulating film provided between the third semiconductor layer and the third gate electrode, wherein
concentration of boron (B) in the third gate electrode is higher than concentration of boron in the second gate electrode, and
the second insulating film includes a third portion in contact with the semiconductor portion and the third portion extends along the third region.

7. The semiconductor memory device according to claim 6, further comprising:
a TEG provided in the third region.

8. The semiconductor memory device according to claim 1, further comprising:
a third region of the semiconductor substrate provided between the second portion and an edge of the semiconductor substrate; and
a second memory cell array provided in the third region, and
the second insulating film includes a third portion in contact with the semiconductor portion and the third portion extends along the third region.

9. The semiconductor memory device according to claim 4, wherein
the at least one second transistor is provided below the at least one memory cell array.

10. A semiconductor wafer comprising:
a semiconductor substrate including a cell region and a dicing region, and a semiconductor portion and an insulating portion provided on a surface;
at least one memory cell array provided in at least one first region of the cell region;
a first transistor provided in a second region of the cell region;
at least one second transistor provided in the at least one first region;
a first insulating film covering the first transistor; and
a second insulating film that is in contact with the first insulating film, wherein
the first transistor comprises:
a first semiconductor layer;
a first gate electrode facing the first semiconductor layer; and
a first gate insulating film provided between the first semiconductor layer and the first gate electrode,
each of the at least one second transistor comprises:
a second semiconductor layer;
a second gate electrode facing the second semiconductor layer; and
a second gate insulating film provided between the second semiconductor layer and the second gate electrode,
concentration of boron (B) in the first gate electrode is higher than concentration of boron in the second gate electrode,
the second insulating film has a smaller diffusion coefficient of hydrogen (H) than the first insulating, and
the second insulating film includes at least one first portion and a second portion in contact with the semiconductor portion, the at least one first portion extends along the at least one first region and the second portion extends along the second region and the second portion is provided outside of the at least one first portion.

11. The semiconductor wafer according to claim 10, wherein
the at least one first portion surrounds the at least one first region and the second portion surrounds the second region.

12. The semiconductor wafer according to claim 10, wherein
the second portion extends along an outer edge the cell region.

13. The semiconductor wafer according to claim 10, wherein
the at least one first region comprises a plurality of first regions partitioned by the at least one first portion, and
the second region is provided between two of the plurality of first regions.

14. The semiconductor wafer according to claim 10, wherein
the first insulating film includes silicon (Si) and oxygen (O), and
the second insulating film includes silicon and nitrogen (N).

15. The semiconductor wafer according to claim 10, further comprising:
a third region provided in the dicing region; and
a third transistor provided in the third region, wherein
the third transistor comprises:
a third semiconductor layer;
a third gate electrode facing the third semiconductor layer; and
a third gate insulating film provided between the third semiconductor layer and the third gate electrode, wherein
concentration of boron (B) in the third gate electrode is higher than concentration of boron in the second gate electrode, and
the second insulating film includes a third portion in contact with the semiconductor portion and the third portion extends along the third region.

16. The semiconductor wafer according to claim 15, further comprising:
a TEG provided in the third region.

17. The semiconductor wafer according to claim 10, further comprising:
a third region provided in the dicing region; and
a second memory cell array provided in the third region,
the second insulating film includes a third portion in contact with the semiconductor portion and the third portion extends along the third region.

18. The semiconductor wafer according to claim 10, wherein
the at least one second transistor is provided below the at least one memory cell array.

19. The semiconductor memory device according to claim 2, further comprising:
at least one second transistor provided in the at least one first region, wherein
each of the at least one second transistor comprises:
a second semiconductor layer;
a second gate electrode facing the second semiconductor layer; and
a second gate insulating film provided between the second semiconductor layer and the second gate electrode, wherein
concentration of boron (B) in the first gate electrode is higher than concentration of boron in the second gate electrode.

20. The semiconductor memory device according to claim 2, wherein
the first insulating film includes silicon (Si) and oxygen (O), and
the second insulating film includes silicon and nitrogen (N).

* * * * *